US012727421B2

(12) United States Patent
Han et al.

(10) Patent No.: US 12,727,421 B2
(45) Date of Patent: Sep. 1, 2026

(54) SUBSTRATE PROCESSING APPARATUS AND SUBSTRATE PROCESSING METHOD

(71) Applicant: SEMES CO., LTD., Chungcheongnam-do (KR)

(72) Inventors: Young Joon Han, Chungcheongnam-do (KR); Gi Hun Choi, Chungcheongnam-do (KR); Seung Tae Yang, Chungcheongnam-do (KR); Sang Woo Park, Chungcheongnam-do (KR); Seong Hyeon Kim, Chungcheongnam-do (KR); Bu Young Jung, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 244 days.

(21) Appl. No.: 17/972,666

(22) Filed: Oct. 25, 2022

(65) Prior Publication Data

US 2023/0215741 A1 Jul. 6, 2023

(30) Foreign Application Priority Data

Dec. 30, 2021 (KR) ........................ 10-2021-0192832

(51) Int. Cl.
*H01L 21/67* (2006.01)
*H10P 72/00* (2026.01)

(52) U.S. Cl.
CPC ...... *H10P 72/0414* (2026.01); *H10P 72/0432* (2026.01)

(58) Field of Classification Search
CPC ......... H01L 21/67051; H01L 21/67103; H01L 21/67; H01L 21/67017; H01L 21/6708; H01L 21/67109; H01L 21/6715; H01L 21/67248; H01L 21/67023; H01L 21/02041; H01L 21/30604; B05C 11/1042; H10P 72/0414; H10P 72/0432; H10P 72/00; H10P 72/0402; H10P 72/0424;

(Continued)

(56) References Cited

U.S. PATENT DOCUMENTS 10,304,687 B2 * 5/2019 Park ........................ B08B 3/047
11,664,212 B2 * 5/2023 Hong ................ H01L 21/02057 438/761

(Continued)

FOREIGN PATENT DOCUMENTS

CN 106158704 A 11/2016
CN 107086189 A 8/2017

(Continued)

OTHER PUBLICATIONS

KR 10-2011-0057679 (Year: 2011).*

(Continued)

*Primary Examiner* — Alexander Markoff
(74) *Attorney, Agent, or Firm* — Carter, DeLuca & Farrell LLP

(57) ABSTRACT

A substrate processing apparatus includes a nozzle unit including a nozzle tip discharging liquid to a substrate; and a liquid supply line supplying the liquid to the nozzle unit, wherein the liquid supply line includes a liquid supply pipe connected to the nozzle tip; a supply valve installed in the liquid supply pipe; and a heater disposed between the nozzle tip and the supply valve in the liquid supply pipe.

19 Claims, 9 Drawing Sheets

(58) Field of Classification Search
CPC ............. H10P 72/0434; H10P 72/0448; H10P 72/0602; H10P 70/00; H10P 72/0404; H10P 50/642
See application file for complete search history.

(56) References Cited

U.S. PATENT DOCUMENTS

2010/0133355 A1* 6/2010 Park ........................ B05B 9/002
239/128
2013/0048609 A1 2/2013 Ito
2015/0348805 A1* 12/2015 Kim .................. H01L 21/67017
156/345.18
2016/0268146 A1 9/2016 Kobayashi
2016/0336170 A1 11/2016 Ishida
2017/0018442 A1* 1/2017 Oh .................... H01L 21/67051
2017/0232457 A1 8/2017 Fujino
2017/0316958 A1* 11/2017 Jung ................. H01L 21/67051
2018/0033632 A1* 2/2018 Park .......................... B08B 3/10
2021/0335596 A1* 10/2021 Hong .................. H01L 21/2636
2021/0398828 A1* 12/2021 Kosai ...................... B08B 13/00
2023/0215741 A1* 7/2023 Han .................. H01L 21/67248
134/1.2

FOREIGN PATENT DOCUMENTS

JP 2006-228496 A 8/2006
JP 2010-021215 A 1/2010
KR 10-2015-0138533 A 12/2015
KR 10-1813897 B1 1/2018
KR 10-2019-0107566 A 9/2019
TW 201030880 * 8/2010

OTHER PUBLICATIONS

JP 2019-160958 (Year: 2019).*
WO 2020/120597 (Year: 2020).*
Chinese Office Action issued by the China National Intellectual Property Administration on May 11, 2026 in corresponding CN Patent Application No. 202211462430.6, with English translation.

* cited by examiner

SUBSTRATE PROCESSING APPARATUS AND SUBSTRATE PROCESSING METHOD

CROSS-REFERENCE TO RELATED APPLICATION(S)

This application claims benefit of priority to Korean Patent Application No. 10-2021-0192832 filed on Dec. 30, 2021 in the Korean Intellectual Property Office, the disclosure of which is incorporated herein by reference in its entirety.

BACKGROUND

1. Field

The present disclosure relates to a substrate processing apparatus and a substrate processing method using the same.

2. Description of Related Art

In general, a plurality of film materials such as a polycrystalline film, an oxide film, a nitride film, a metal film, and the like may be formed on a wafer used as a semiconductor substrate in a process of manufacturing a semiconductor device. A photoresist film may be coated on the film materials, and a pattern drawn on a photomask may be transferred to the photoresist film by an exposure process. Thereafter, a desired pattern may be formed on the wafer by an etching process.

An etching apparatus used in the etching process may be classified as a dry etching apparatus or a wet etching apparatus. Thereamong, the wet etching apparatus may be an apparatus for processing a substrate using a plurality of liquids, for example, an etchant, a cleaning liquid, and a rinsing liquid. Such a substrate processing apparatus may perform a process of etching an unnecessary portion of a thin film formed on the substrate, and a process of cleaning foreign substances remaining on a processed surface of the substrate.

FIG. 1 is a graph illustrating a relationship between an etching rate and a temperature of phosphoric acid. High-temperature phosphoric acid may be required for a high etching rate. In general, when the temperature of phosphoric acid increases by 10° C., the etching rate may increase by 10%. Therefore, it may be important to supply a high-temperature liquid to a substrate. To this end, a liquid may be heated and supplied in a liquid supply tank or the like, and a temperature of the liquid may be reduced in a process of supplying the liquid to a nozzle unit through a liquid supply line. The higher the temperature of the liquid, the greater the temperature drop. In addition, when an additional additive is mixed with the liquid in order to increase an etching rate, a reduction in temperature according to a temperature of the additional additive may be largely affected.

Prior Art Document 1: Korea Patent No. 10-1813897

SUMMARY

An aspect of the present disclosure is to provide a substrate processing apparatus and a substrate processing method, discharging liquid in a high temperature state.

According to an aspect of the present disclosure, a substrate processing apparatus includes a nozzle unit including a nozzle tip discharging liquid to a substrate; and a liquid supply line supplying the liquid to the nozzle unit, wherein the liquid supply line includes a liquid supply pipe connected to the nozzle tip; a supply valve installed in the liquid supply pipe; and a heater disposed between the nozzle tip and the supply valve in the liquid supply pipe.

In an embodiment, the nozzle unit may include a nozzle arm extending onto an upper side of the substrate; and the nozzle tip connected to the nozzle arm, wherein the liquid supply pipe may include a first supply pipe connecting a liquid supply unit and the nozzle arm; and a second supply pipe passing through the nozzle arm from the first supply pipe and connected to the nozzle tip, wherein the heater may be installed in the second supply pipe.

In another embodiment, in addition to the above-described configuration, the present disclosure may further include a liquid recovery line recovering the liquid from the liquid supply line, wherein the liquid recovery line may include a liquid recovery pipe branched off the liquid supply pipe; a recovery valve installed on the liquid recovery pipe; and a cooler disposed between a branch point in the liquid recovery pipe, branched off the liquid supply pipe, and the recovery valve.

In this case, the second supply pipe may include a supply pipe portion in which the heater is installed and a discharge pipe portion connected to the nozzle tip, based on the branch point at which the liquid recovery pipe is branched, wherein at least a portion of the discharge pipe portion may be disposed on a height level, higher than a height level of the branch point.

As another embodiment, the liquid supply pipe may be provided as a plurality of liquid supply pipes, wherein the plurality of liquid supply pipes may be connected to the nozzle tip and spaced apart from the nozzle arm.

In addition, according to another aspect of the present disclosure, a substrate processing apparatus includes a processing chamber including a processing region and a maintenance region, partitioned by a horizontal partition wall; a processing vessel installed in the processing chamber and having a processing space processing a substrate; a support unit supporting the substrate in the processing space; a nozzle unit including a nozzle tip discharging liquid to the substrate; and a liquid supply line supplying the liquid to the nozzle unit, wherein the nozzle unit includes a nozzle arm disposed in the processing region and extending onto an upper side of the substrate; and a nozzle tip connected to the nozzle arm, wherein the liquid supply line includes a liquid supply pipe connected to the nozzle tip; a supply valve installed in the liquid supply pipe; and a heater installed in the liquid supply pipe between the nozzle tip and the supply valve.

According to another aspect of the present disclosure, a substrate processing method includes a discharging process of discharging liquid to a substrate through a nozzle tip of a nozzle unit, wherein the discharging process includes a supply operation of supplying the liquid through a supply valve of a liquid supply line; a heating operation of heating the liquid passing through the supply valve with a heater; and a discharging operation of discharging the heated liquid from the nozzle tip.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
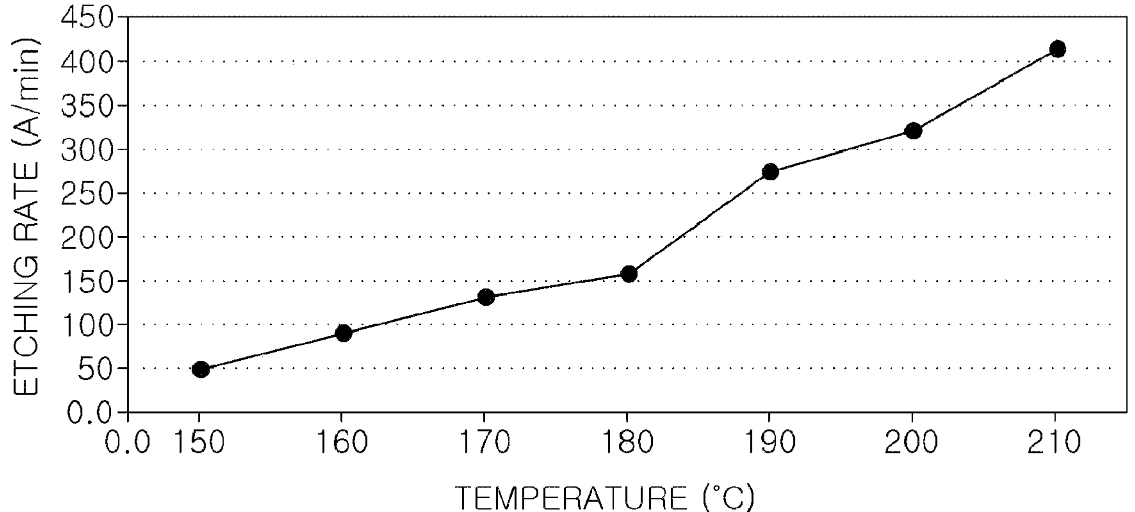
FIG. 1 is a graph illustrating a relationship between an etching rate and a temperature of phosphoric acid.

Hereinafter, preferred embodiments will be described in detail such that those of ordinary skill in the art easily practices the present disclosure with reference to the accompanying drawings. However, in describing a preferred embodiment of the present disclosure in detail, if it is determined that a detailed description of a related known function or configuration unnecessarily obscures the gist of the present disclosure, the detailed description thereof will be omitted. In addition, the same reference numerals may be used throughout the drawings for parts having similar functions and operations. In addition, in this specification, terms such as 'on,' 'upper portion,' 'upper surface,' 'below,' 'lower portion,' 'lower surface,' 'side surface,' and the like may be based on the drawings, and in fact, may be changed depending on a direction in which components is disposed.

In addition, throughout the specification, when a portion is 'connected' to another portion, may include not only 'directly connected.' but also 'indirectly connected' to other components interposed therebetween. In addition, 'including' a certain component means that other components are further included, rather than excluding other components, unless otherwise stated.

Figure 2:
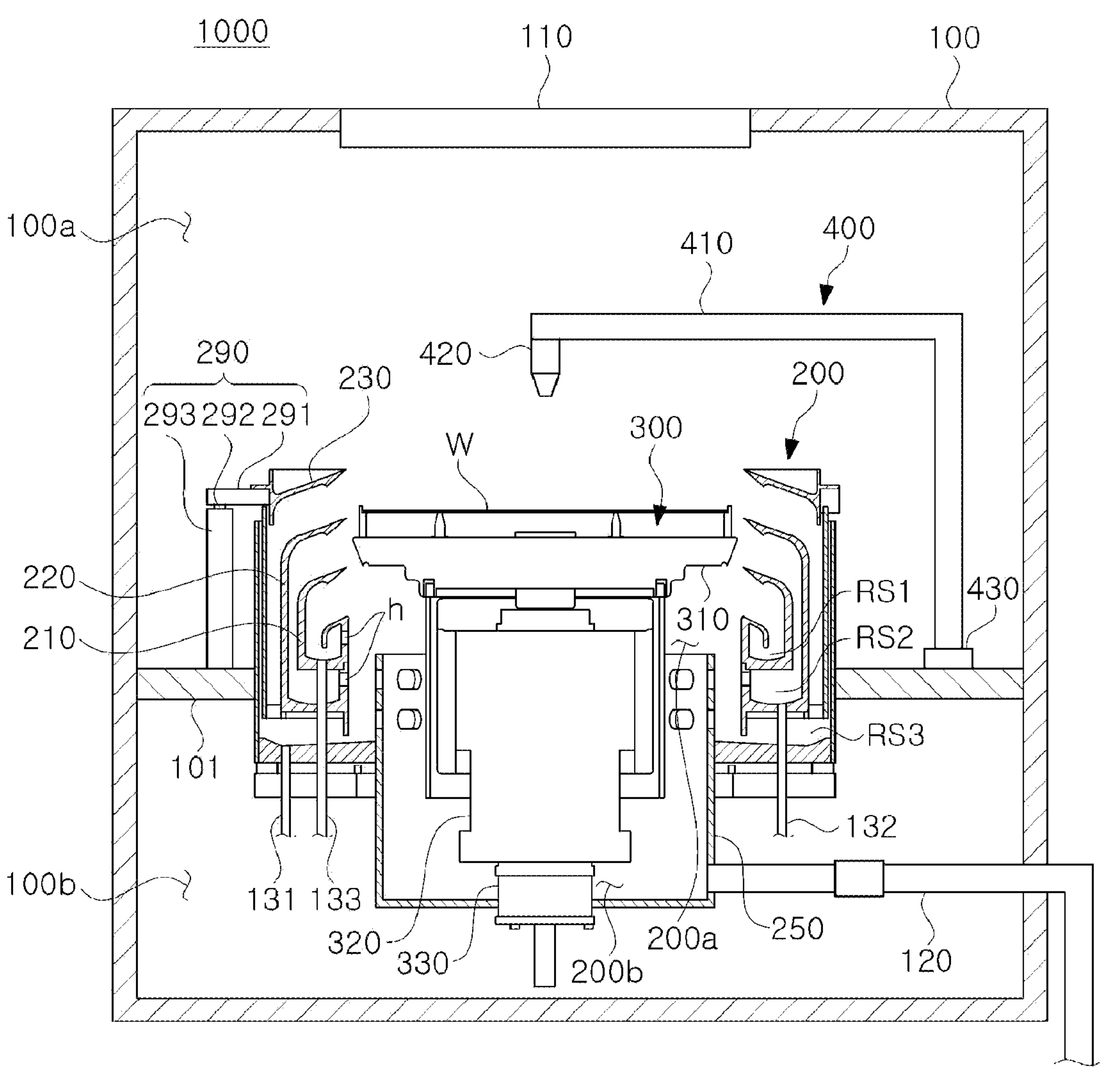
FIG. 2 is a view illustrating a substrate processing apparatus to which the present disclosure is applied.

FIG. 2 is a view illustrating a substrate processing apparatus to which the present disclosure is applied.

Referring to the drawings, a substrate processing apparatus 1000 of the present disclosure may include a processing chamber 100 for performing a process with respect to a substrate W using a liquid. In the processing chamber 100, the process with respect to the substrate W may be performed in a state in which the substrate W is horizontally maintained. The process may be a process of etching a nitride film formed on the substrate W. In this case, the liquid may contain phosphoric acid. Furthermore, the processing chamber 100 may be used in a process of removing foreign substances and film materials, remaining on a surface of the substrate W, using various liquids.

Specifically, the processing chamber 100 may provide a sealed inner space, and a fan filter unit 110 may be installed in an upper portion of the processing chamber 100. The fan filter unit 110 may generate a vertical air flow in the processing chamber 100. The fan filter unit 110 may be a unit in which a filter and an air supply fan are modularized into one unit, and may filter and supply clean air into the processing chamber 100. The clean air may be passed through the fan filter unit 110 and may be supplied into the processing chamber 100, to form the vertical air flow. This vertical air flow may provide a uniform air flow over the substrate W, and may discharge and remove contaminants (fumes) generated in a process in which a surface of the substrate W is treated by a processing fluid, together with air, to discharge lines 131, 132, and 133 through suction ducts 210, 220, and 230 of a processing vessel 200, to maintain a high degree of cleanliness in the processing vessel.

The processing chamber 100 may include a processing region 100*a* and a maintenance region 100*b*, partitioned by a horizontal partition wall 101. A driving member 293 of a lifting unit 290 and a driving member 430 of a nozzle unit 400 may be installed on the horizontal partition wall 101. In addition, the maintenance region 100*b* may be a space in which the discharge lines 131, 132, 133 and the exhaust member 120, connected to the processing vessel 200, are located, and is preferable to be isolated from the processing region 100*a* in which the substrate W is processed.

The substrate processing apparatus 1000 of the present disclosure may include a processing vessel 200, a support unit 300, and a nozzle unit 400, in the processing chamber 100. The processing vessel 200 may be installed in the processing chamber 100, may have a cylindrical shape with an open upper surface, and may provide a processing space for processing the substrate W. The open upper surface of the processing container 200 may be provided as a passage for carrying out and carrying in the substrate W. In this case, the support unit 300 may be located in the processing space. In this case, during the process, the support unit 300 may support the substrate W and may rotate the substrate W.

In addition, the processing vessel 200 may provide an upper space 200*a* in which a spin head 310 of the support unit 300 is located, and a lower space 200*b* in which an exhaust duct 250 is connected to a lower portion to perform forced exhaust. The exhaust duct 250 may be connected to an exhaust member 120 extending into an external space of the processing chamber 100. Annular first, second and third suction ducts 210, 220, and 230 for introducing and sucking a chemical liquid and gas, scattered on the rotating substrate W, may be arranged to have multi-stages in the upper space 200*a* of the processing container 200. The first, second and third suction ducts 210, 220, and 230 may have exhaust ports h communicating with one common annular space (corresponding to the lower space of the processing vessel).

In this case, the first, second and third suction ducts 210, 220, and 230 may provide first to third recovery spaces RS1, RS2, and RS3, into which an air flow including a liquid and fumes, scattered from the substrate W, is introduced. The first recovery space RS1 may be partitioned by the first suction duct 210, the second recovery space RS2 may be formed as a spaced apart space between the first suction duct 210 and the second suction duct 220, and the third recovery space RS3 may be formed as a spaced apart space between the second suction duct 220 and the third suction duct 230.

In addition, the processing vessel 200 may be coupled to the lifting unit 290 for changing a vertical position of the processing vessel 200. The lifting unit 290 may linearly move the processing vessel 200 in a vertical direction. As the processing vessel 200 moves in the vertical direction, a relative height of the processing vessel 200 with respect to the spin head 310 may be changed. The lifting unit 290 may include a bracket 291, a moving shaft 292, and a driving member 293. The bracket 291 may be fixedly installed on an outer wall of the processing vessel 200, and the moving shaft 292, which may be moved in the vertical direction by the driving member 293, may be fixedly coupled to the bracket 291. When the substrate W is loaded into or unloaded from the spin head 310, the processing vessel 200 may descend such that the spin head 310 protrudes in an upper portion of the processing vessel 200.

In addition, during a process, a height of the processing vessel 200 may be adjusted such that a liquid is introduced into a predetermined suction duct (e.g., 210, 220, and 230) according to a type of the liquid supplied to the substrate W. Therefore, the relative vertical position between the processing vessel 200 and the substrate W may be changed. Therefore, the processing vessel 200 may change types of liquid and contaminant gas recovered for each recovery space (e.g., RS1, RS2, and RS3).

The support unit 300 may be installed in the processing container 200. The support unit 300 may support the substrate W during a process, and may be rotated by a driving member 330 during the process. In addition, the support unit 300 may have a spin head 310 having a circular upper surface. A support shaft 320 supporting the spin head 310 may be connected to a lower portion of the spin head 310, and the support shaft 320 may be rotated by the driving member 330 connected to a lower end of the support shaft 320. In this case, the driving member 330 may be provided with a motor or the like, and as the support shaft 320 is rotated by the driving member 330, the spin head 310 and the substrate W may be rotated.

Figure 3:
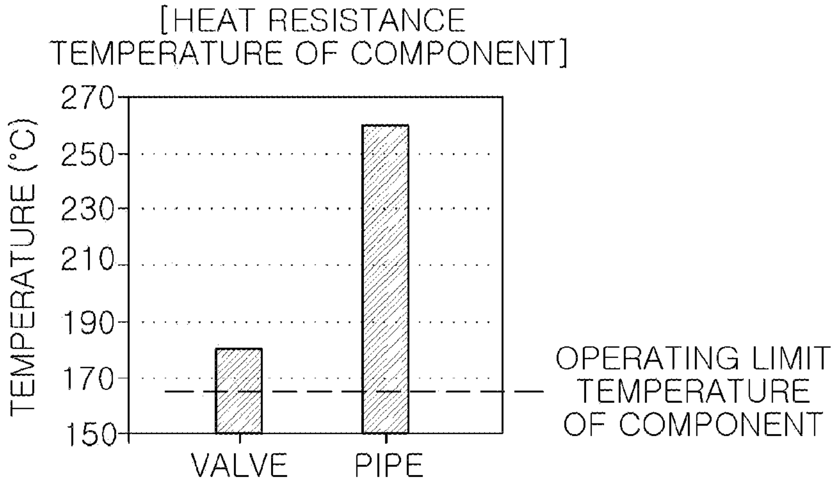
FIG. 3 is a graph illustrating a heat resistance temperature of a component.
Figure 4:
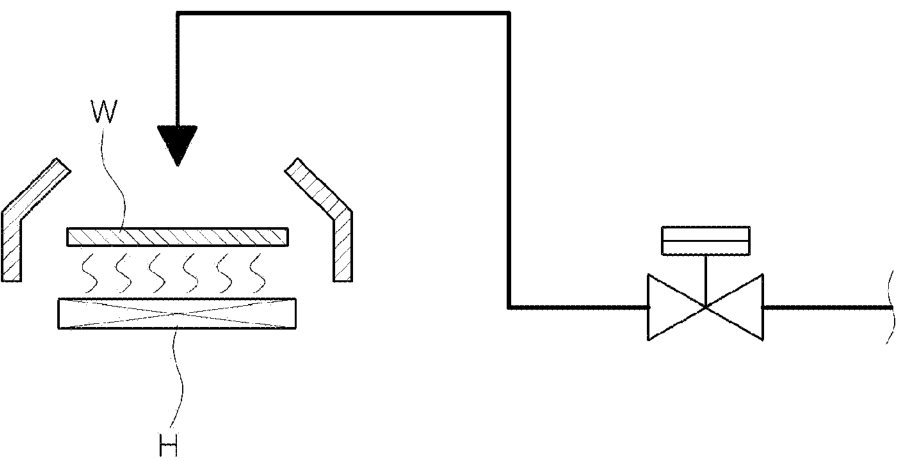
FIG. 4 is a view illustrating a configuration for heating a liquid in a substrate processing apparatus according to the prior art.

The nozzle unit 400 may discharge a liquid to the substrate W supported by the support unit 300. In this case, the liquid may include phosphoric acid to etch a nitride film formed on the substrate W. In general, in a substrate processing apparatus, a liquid (e.g., phosphoric acid) may be heated in a liquid supply tank (e.g., a liquid supply unit) for an etching process, and may be supplied to a nozzle unit 400 through a liquid supply line 500. In such a substrate processing apparatus, a resin material may be used, instead of a metal as an internal component, in consideration of acidity of a liquid for etching. As illustrated in FIG. 3, in a valve, a maximum allowable temperature related to heat resistance of a component may be about 180° C. Therefore, in a substrate processing apparatus according to the prior art, as an operating limit temperature of a component related to supply of a liquid is set in consideration of a heat resistance temperature of the component, a heating temperature of the liquid discharged to a substrate may be safely lower than a maximum allowable temperature of the valve, for example, may be about 165° C., and a temperature of the substrate may be further increased by an indirect heating method of a heater H. For example, as an example for increasing an etching rate, as illustrated in FIG. 4, an indirect heating method in which a lower surface of a substrate W is heated by a heater H to increase a temperature of the substrate, to further increase a temperature of a liquid discharged to the substrate W, may be adopted. In this indirect heating method, it may take a considerable time to heat the substrate W to a desired appropriate temperature, and a temperature of the substrate W may not ascend uniformly as a whole.

Figure 5:
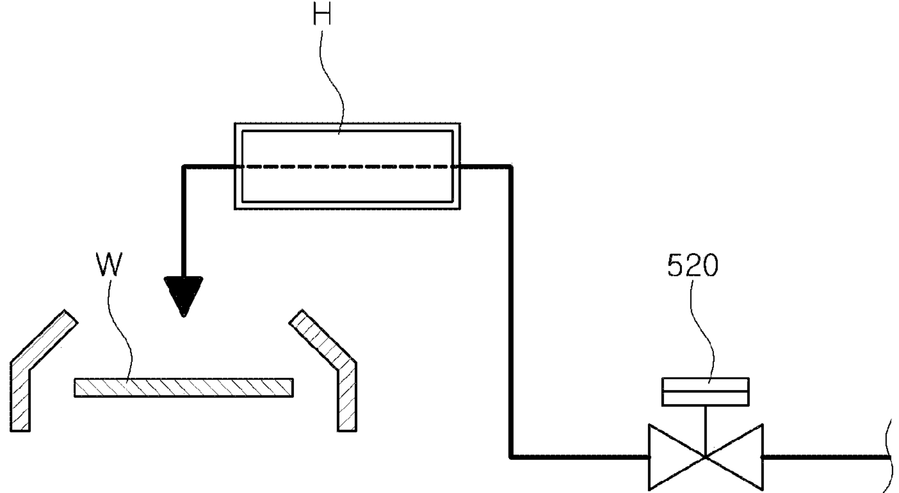
FIG. 5 is a view illustrating a basic configuration of heating a liquid in a substrate processing apparatus according to the present disclosure.

In the present disclosure, as illustrated in FIG. 5, a heater H may be installed to discharge a liquid to a substrate W at an ultra-high temperature (higher than 200° C.) by a direct heating method. For example, the present disclosure may be configured to discharge the liquid passing through a supply valve 520 to the substrate W after the heater H is heated. For example, in the present disclosure, the heater H may be installed next to the supply valve 520 in consideration of a heat resistance limit temperature of a component such as a valve.

Figure 6:
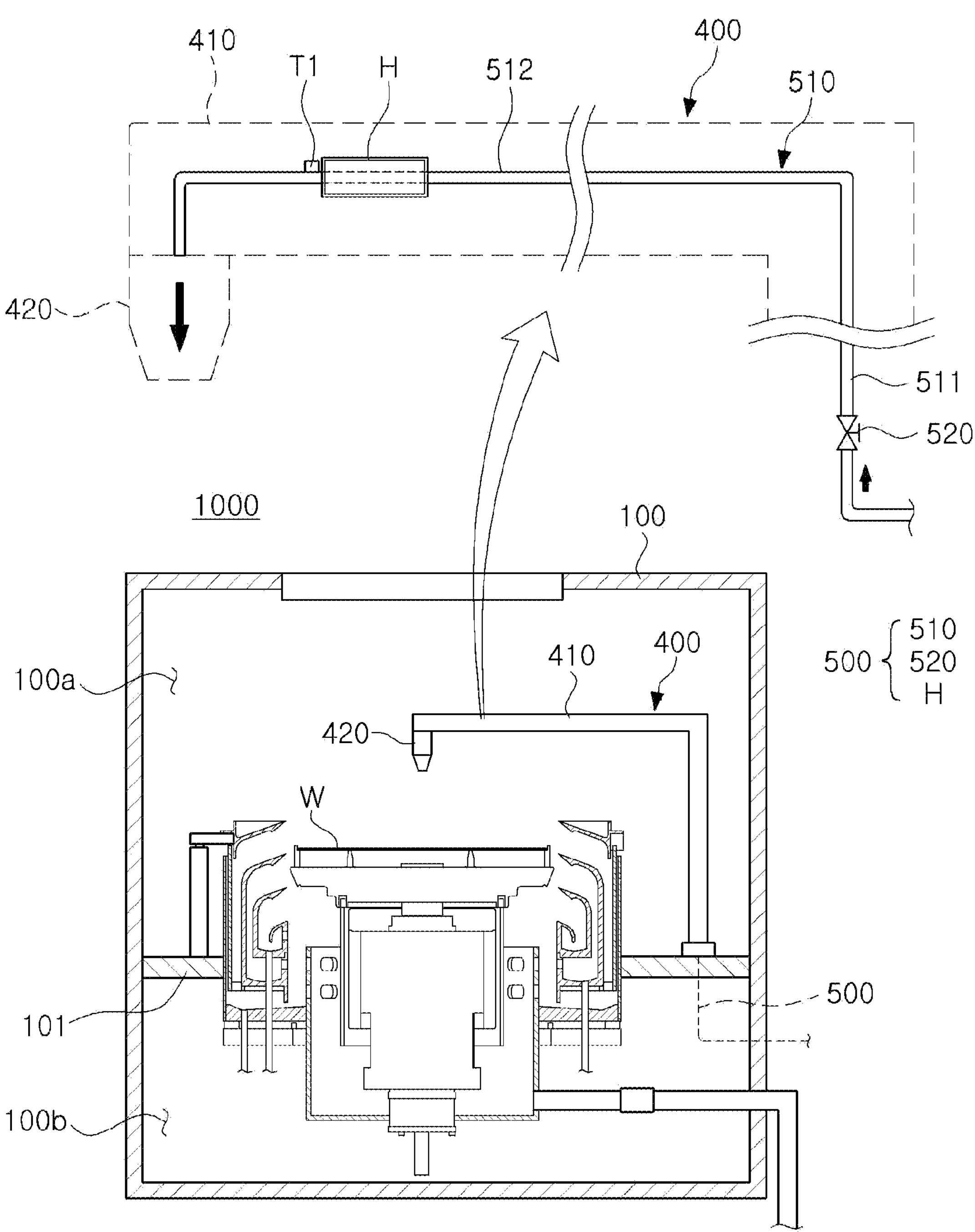
FIG. 6 is a view illustrating a substrate processing apparatus according to an embodiment of the present disclosure.

FIG. 6 is a view illustrating a substrate processing apparatus according to an embodiment of the present disclosure.

Referring to the drawings, a substrate processing apparatus 1000 according to an embodiment of the present disclosure may include a liquid supply line 500 together with a nozzle unit 400, as described above. In this case, the liquid supply line 500 may supply a liquid to the nozzle unit 400, and may heat the liquid immediately before discharging the liquid from a nozzle tip 420.

The nozzle unit 400 may include a nozzle arm 410 and a nozzle tip 420. In this case, the nozzle arm 410 may be rotated and lifted by a driving member 430 mounted in a lower portion. Also, the nozzle arm 410 may be installed in a processing chamber 100, and may extend above a substrate W. Among a processing region 100*a* corresponding to an upper space and a maintenance region 100*b* corresponding to a lower space, partitioned by a horizontal partition wall 101, the nozzle arm 410 may be installed in the processing region 100*a* of the processing chamber 100. In addition, the nozzle tip 420 may be installed in an end portion of the nozzle arm 410, and may be disposed above the substrate.

In addition, the liquid supply line 500 may include a liquid supply pipe 510, a supply valve 520, and a heater H. The liquid supply pipe 510 may be connected to the nozzle tip 420, the supply valve 520 may be installed in the liquid supply pipe 510, and the heater H may be disposed between the nozzle tip 420 and the supply valve 520 in the liquid supply pipe 510.

Specifically, the liquid supply pipe 510 may include a first supply pipe 511 and a second supply pipe 512. The first supply pipe 511 may connect a liquid supply unit (not illustrated) and the nozzle arm 410. In this case, the first supply pipe 511 may have a structure extending from the liquid supply unit, passing through the maintenance region of the processing chamber, and connected to the nozzle arm 410. In addition, the second supply pipe 512 may extend from the first supply pipe 511, may pass through the nozzle arm 410, and may be connected to the nozzle tip 420. For example, the second supply pipe 512 may have one end portion connected to the first supply pipe 511 and extended while passing through the nozzle arm 410, and the other end portion connected to the nozzle tip 420. Furthermore, the first supply pipe 511 and the second supply pipe 512 may not have a physically divided configuration, and even when they are provided as a single supply pipe, a portion up to the nozzle arm 410 may be referred to as the first supply pipe 511 and a portion extending outwardly from the nozzle arm 410 may be referred to as the second supply pipe 512.

Also, the supply valve 520 may be installed in the first supply pipe 511 of the liquid supply pipe 510. For example, the supply valve 520 may be installed in the first supply pipe 511 disposed in the maintenance region, and may be disposed outside of the nozzle arm 410. Furthermore, although not illustrated in the drawings, the supply valve 520 is not limited thereto, and may be installed before the heater H, based on a supply direction of the liquid in the second supply pipe 512 passing through the nozzle arm 410.

In addition, the heater H may be installed in the liquid supply pipe 510, and may be disposed between the nozzle tip 420 and the supply valve 520. For example, the heater H may be disposed next to the supply valve 520, based on a supply direction of the liquid, in the liquid supply pipe 510, to heat the liquid passing through the supply valve 520. In this case, the heater H may be installed in the second supply pipe 512 passing through the nozzle arm 410, to have a structure disposed in the nozzle arm 410. As such, as the heater H is disposed in the nozzle arm 410 through which the second supply pipe 512 passes, as close to the nozzle tip 420 as possible, loss of heat in a process of flowing the liquid into the nozzle tip 420 may be minimized. The heater H may have a configuration heating the liquid supply pipe 510 or the liquid in the liquid supply pipe 510 to increase a temperature of the liquid, and is not limited by the present disclosure, and any conventional heating configuration may be utilized. As described above, in the present disclosure, the liquid passing through the supply valve 520 may be heated in the liquid supply line 500 by the heater H, to discharge the liquid through the nozzle tip 420 in an ultra-high temperature state. Therefore, the present disclosure may shorten an etching time, and may improve an etching rate by the liquid discharged in the ultra-high temperature state.

In this case, the supply valve 520 may be a valve closest to the nozzle tip 420, among a plurality of valves installed in the liquid supply pipe 510.

Furthermore, in the present disclosure, a first temperature sensor T1 for measuring a temperature of the liquid heated by the heater H may be installed in the liquid supply pipe 510. The first temperature sensor T1 may be electrically connected to a controller (not illustrated) controlling the substrate processing apparatus 1000, such that the controller automatically controls the heater H based on temperature data received from the first temperature sensor T1.

Figure 7:
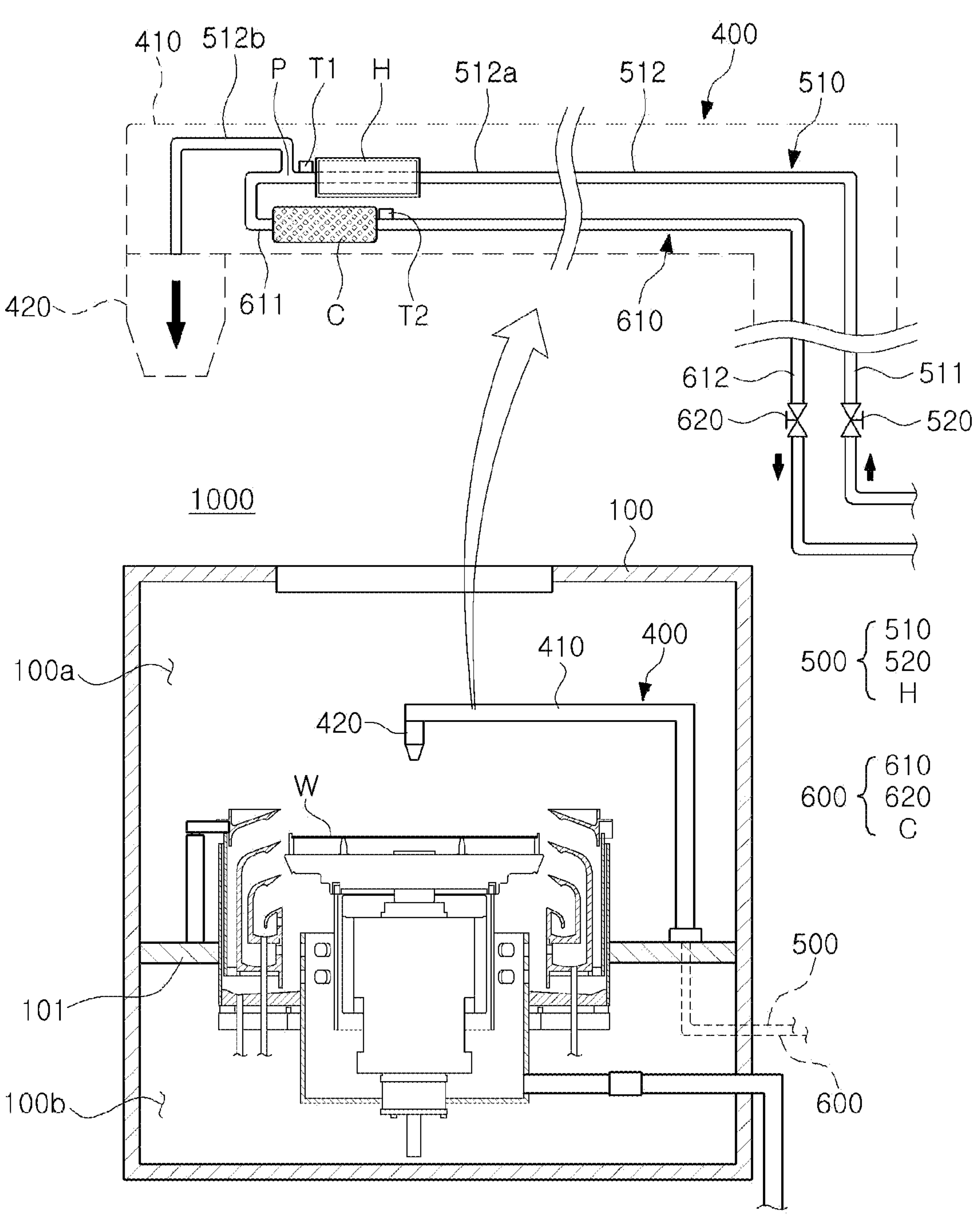
FIG. 7 is a view illustrating a substrate processing apparatus according to another embodiment of the present disclosure.

FIG. 7 is a view illustrating a substrate processing apparatus according to another embodiment of the present disclosure.

Referring to the drawings, an embodiment of FIG. 7 of the present disclosure may include a configuration in which a liquid recovery line 600 may be connected to a liquid supply line 500 to circulate a liquid, in addition to the configuration of the above-described embodiment of FIG. 6. The liquid recovery line 600 may include a liquid recovery pipe 610, a recovery valve 620, and a cooler C. In this case, the liquid recovery pipe 610 may be branched off a liquid supply pipe 510, and the recovery valve 620 may be installed in the liquid recovery pipe 610. In addition, the cooler C may be disposed between a branch point P, branched off the liquid supply pipe 510 in the liquid recovery pipe 610, and the recovery valve 620.

Specifically, the liquid recovery pipe 610 may include a first recovery pipe 611 and a second recovery pipe 612. The first recovery pipe 611 may be branched off a second supply pipe 512 of the liquid supply pipe 510, and may pass through a nozzle arm 410. In addition, the second recovery pipe 612 may extend from the first recovery pipe 611 to an external space of the nozzle arm 410. For example, the second recovery pipe 612 may have one end connected to the first recovery pipe 611 and extending outside a maintenance region of a processing chamber. As an example, the liquid may be returned to a liquid supply unit (not illustrated, for example, a liquid supply tank) through the second recovery pipe 612, and may be supplied from the liquid supply tank again through the liquid supply pipe 510. Furthermore, the first recovery pipe 611 and the second recovery pipe 612 may not have a configuration physically divided, and even when they are provided as a single supply pipe, a portion up to a lower end of the nozzle arm 410 may be referred to as the first recovery pipe 611, and a portion extending outwardly from the lower end of the nozzle arm 410 may be referred to as the second recovery pipe 612.

Also, the recovery valve 620 may be installed in the second recovery pipe 612 of the liquid recovery pipe 610. For example, the recovery valve 620 may be installed in the second supply pipe 512 disposed in the maintenance region, and may be disposed outside the nozzle arm 410. Furthermore, although not illustrated in the drawings, the recovery valve 620 is not limited thereto, and may be installed after the cooler C, based on a recovery direction of the liquid in the first recovery pipe 611 passing through the nozzle arm 410.

In addition, the cooler C may be installed in the liquid recovery pipe 610, and may be disposed between the branch point P, branched off the liquid supply pipe 510, and the recovery valve 620. Such a cooler C may be installed in the second recovery pipe 612. Before or after the etching process is performed, the liquid may be circulated through the liquid recovery line 600 without being discharged through the nozzle tip 420. In this circulation process, as the second recovery pipe 612 is cooled by the cooler C to lower a temperature of the liquid, components such as the recovery valve 620 of the liquid recovery line 600 may not be thermally damaged. For example, the liquid may be cooled by the cooler C in the circulation process, to be maintained on or below a heat resistance allowable temperature of the components such as the recovery valve 620 or the like included in the liquid recovery line 600.

The second supply pipe 512 may include a supply pipe portion 512*a* and a discharge pipe portion 512*b*. For example, the second supply pipe 512 may be divided to have the supply pipe portion 512*a* and the discharge pipe portion 512*b*. The supply pipe portion 512*a* may be a portion in which a heater H is installed, based on the branch point P at which the liquid recovery pipe 610 is branched. In addition, the discharge pipe portion 512*b* may be a portion connected to the nozzle tip 420 based on the branch point P. In a state in which the supply valve 520 of the liquid supply pipe 510 is opened, the recovery valve 620 may be closed when the liquid is discharged, and the recovery valve 620 may be opened when the liquid is circulated. When a heater H is installed in the liquid supply pipe 510, the liquid supply pipe 510 may also be heated to an ultra-high temperature (higher than 200° C.) by the heater H. Therefore, a component that cannot withstand ultra-high temperatures, such as a valve, may not be installed between the heater H and the nozzle tip 420. Therefore, the present disclosure may take a structure in which at least a portion of the discharge pipe portion 512*b* is disposed in a position higher than the branch point P.

As a specific example, as illustrated in the drawings, the discharge pipe portion 512*b* may be arranged to extend from the branch point P toward the nozzle tip 420, to ascend and then descend. When the liquid is discharged, the recovery valve 620 may be closed. Due to the closing of the recovery valve 620, a height level of the liquid at the branch point P may gradually increase to discharge a portion of the liquid in the discharge pipe portion 512*b*, higher than a height level of the branch point P, through the nozzle tip 420. When the recovery valve 620 is opened to circulate the liquid, as the height level of the liquid at the branch point P does not increase, e.g., discharge of the liquid through the nozzle tip 420 due to a water head difference (a water level difference) may not be performed. As described above, in the present disclosure, even when the heater H is installed in the nozzle unit 400, one of discharge or circulation of the liquid may be selected and performed without a configuration of a valve.

Furthermore, in the present disclosure, a first temperature sensor T1 for measuring a temperature of the liquid heated by the heater H may be installed in the liquid supply pipe 510. Also, a second temperature sensor T2 for measuring a temperature of the liquid cooled by the cooler C may be installed in the liquid recovery pipe 610. The first temperature sensor T1 and the second temperature sensor T2 may be electrically connected to a controller (not illustrated) for controlling the substrate processing apparatus 1000, such that the controller automatically controls the heater H and cooler C, based on temperature data received from the first temperature sensor T1 and the second temperature sensor T2.

In addition, the second supply pipe 512 and the first recovery pipe 611, passing through the nozzle arm 410, may be formed of a material containing quartz. The nozzle arm 410 may also be heated to a very high temperature by the heater H disposed in the nozzle arm 410, and the second supply pipe 512 and the first recovery pipe 611 may be formed of a quartz material having excellent heat resistance, and may thus increase durability. In this case, the first supply pipe 511 and the second recovery pipe 612, located at a place at which the heater H is not disposed, e.g., disposed outside the nozzle arm 410, may be formed of a material containing a resin, not a quartz material.

Components having the same reference numerals as those in FIG. 6, among components not described in FIG. 7, may be the same components, and thus a detailed description thereof will be omitted.

Figure 8:
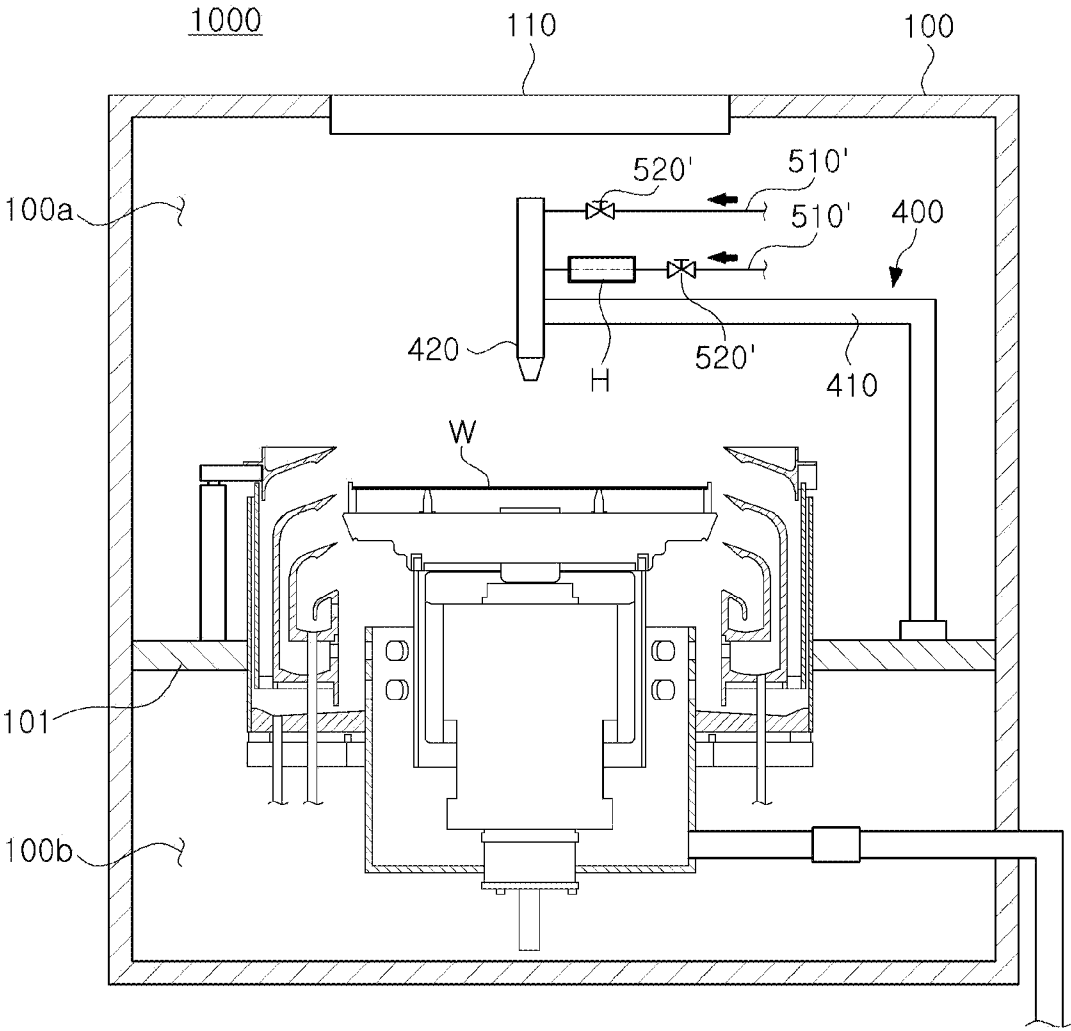
FIG. 8 is a view illustrating a substrate processing apparatus according to another embodiment of the present disclosure.

FIG. 8 is a view illustrating a substrate processing apparatus according to another embodiment of the present disclosure.

Referring to the drawings, in the present disclosure, unlike the embodiments illustrated in FIGS. 6 and 7, a heater H may be disposed outside a nozzle arm 410. For example, in the embodiment of FIG. 6 and another embodiment of FIG. 7, a heater H may be disposed in a nozzle arm 410, but in another embodiment of FIG. 8, a heater H may be disposed outside a nozzle arm 410. Specifically, a liquid supply pipe 510' illustrated in FIG. 8 may not pass through the nozzle arm 410, and may be disposed to be spaced apart from the nozzle arm 410. Therefore, the liquid supply pipe 510' may directly supply a liquid to a nozzle tip 420 without being supplied to the nozzle tip 420 through the nozzle arm 410. The heater H may be installed between a supply valve 520', closest to the nozzle tip 420, and the nozzle tip 420, in the liquid supply pipe 510'. Therefore, when the liquid is supplied to the nozzle tip 420 through the liquid supply pipe 510', the heater H may heat the liquid, passed through the supply valve 520', to discharge the liquid to a substrate W in an ultra-high temperature. In this case, the supply valve 520' may be disposed in the liquid supply pipe 510' in a processing region 100*a* of a processing chamber 100. Furthermore, the liquid supply pipe 510' may be provided as a plurality of liquid supply pipes 510', the plurality of liquid supply pipes 510' may be connected to the nozzle tip 420, and the heater H may be installed in at least one liquid supply pipe 510' thereamong.

In addition, components having the same reference numerals as in FIG. 6, among components not described in FIG. 8, may be the same components, and thus a detailed description thereof will be omitted.

A substrate processing method using a substrate processing apparatus 1000 according to the present disclosure will be described with reference to FIG. 9 as follows.

Figure 9:
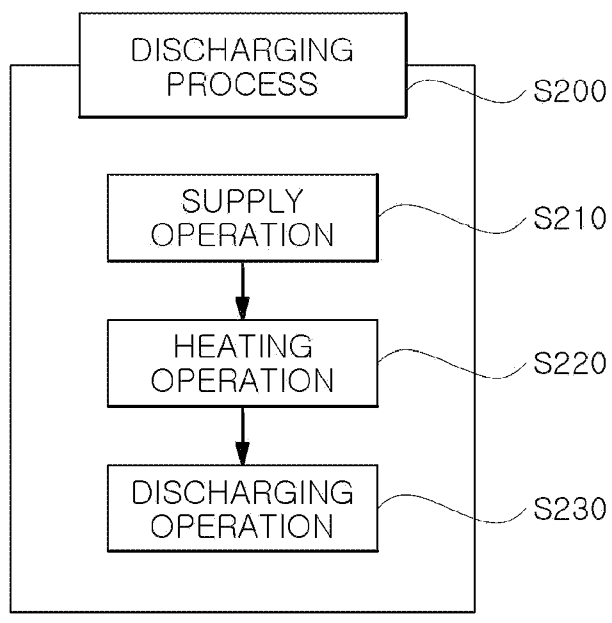
FIG. 9 is a flowchart illustrating a discharging process in a substrate processing method according to the present disclosure.

Referring to FIG. 9 based on FIGS. 6 to 8, the substrate processing method may include a discharging process S200 of discharging liquid to a substrate W through a nozzle tip 420 of a nozzle unit 400. The discharging process S200 may include a supply operation S210, a heating operation S220, and a discharging operation S230. In the supply operation S210, the liquid may be supplied through a supply valve 520 of a liquid supply line 500. In addition, in the heating operation S220, the liquid passing through the supply valve 520 may be heated by a heater H of the liquid supply line 500. Finally, the discharging operation S230 may discharge the heated liquid from the nozzle tip 420. As such, the discharging process S200 proceeding in order of the supply operation S210, the heating operation S220, and the discharging operation S230 may heat the liquid by the heater H, before discharging the liquid passed through the supply valve 520, to discharge the same to the substrate W at an ultra-high temperature, to shorten an etching time and improve an etching rate.

Specifically, referring to FIG. 9 based on FIGS. 6 and 7, immediately before discharging liquid, a nozzle arm 410 may heat the liquid by a heater H to discharge the liquid. Specifically, as a liquid supply line 500 passes through a nozzle arm 410 of a nozzle unit 400, before discharging liquid from a nozzle tip 420 in a heating operation S220, the liquid of liquid supply line 500 may be heated in the nozzle arm 410 by a heater H. Furthermore, before the heating operation S220, the liquid may be preheated by a preheater (not illustrated), before the liquid reaches the nozzle unit 400.

Figure 10:
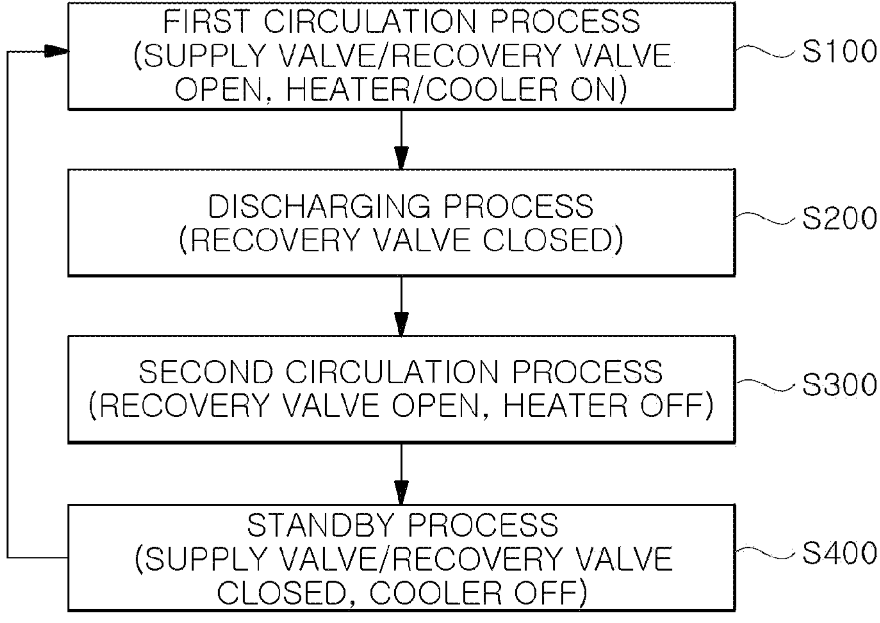
FIG. 10 is a flowchart illustrating a substrate processing method according to the present disclosure.

And, referring to FIG. 10 based on FIG. 7, the present disclosure may further include a first circulation process S100. The first circulation process S100 may be performed as a preparation process, before the discharging process S200. In this case, a liquid recovery line 600 may be connected to a liquid supply line 500, e.g., a liquid recovery line 600 including a recovery valve 620 may be branched off a liquid supply line 500. Specifically, in the first circulation process S100, a supply valve 520 of the liquid supply line 500 and the recovery valve 620 of the liquid recovery line 600 may be opened to recover the liquid supplied from the liquid supply line 500 to the liquid recovery line 600 through the nozzle unit 400, and circulate the same. In contrast, in the discharging process S200, the recovery valve 620 may be closed to discharge the liquid through the nozzle unit 400, without being recovered to the liquid recovery line 600. In the first circulation process S100, a heater H of the liquid supply line 500 and a cooler C of the liquid recovery line 600 may be operated. In the present disclosure, before performing the discharging process S200, the first circulation process S100 may be performed to gradually heat the liquid by the heater H. In addition, the cooler C may cool the liquid recovered through the liquid recovery line 600 such that components such as a valve in the liquid recovery line 600 are not thermally damaged.

And, in the present disclosure, when a liquid ascends to a target temperature for discharging by the heater H in the first circulation process S100, the first circulation process S100 may be converted to the discharging process S200. In the discharging process S200, the recovery valve 620 may be closed to ascend a height level of the liquid in the liquid supply line 500 to a branch point P at which the liquid recovery line 600 is downwardly branched, to discharge the liquid through the nozzle tip 420. In contrast, in the first circulation process S100, a height level of the liquid may be lower than the branch point P due to opening of the recovery valve 620, e.g., the liquid may not be discharged due to a water head difference (a water level difference).

The present disclosure may further include a second circulation process S300. The second circulation process S300 may be a process after the discharging process S200, and may be a process of opening the recovery valve 620 and stopping an operation of the heater H. In this second circulation process S300, the liquid heated in the discharging process S200 may be cooled by the cooler C.

Furthermore, the present disclosure may further include a standby process S400. The standby process S400 may be a process of closing the supply valve 520 and the recovery valve 620 and stopping an operation of the cooler C. In the present disclosure, when the liquid falls below a set temperature by the cooler C in the second circulation process S300, the second circulation process S300 may be converted to the standby process S400. And, in the present disclosure, after this standby process S400, the above-described first circulation process S100 may be performed again.

The present disclosure may be configured such that a heater heats a liquid, passed through a supply valve of the liquid supply line, to have effects of shortening an etching time and improving an etching rate as the liquid is discharged to a substrate in a high temperature state.

While example embodiments have been illustrated and described above, it will be apparent to those skilled in the art that modifications and variations could be made without departing from the scope of the present disclosure as defined by the appended claims.

What is claimed is:

1. A substrate processing apparatus comprising:

a nozzle unit including a nozzle arm and a nozzle tip discharging liquid to a substrate, wherein the liquid is configured for etching a film formed on the substrate; and a liquid supply line supplying the liquid to the nozzle unit; and a liquid recovery line including a liquid recovery pipe branched from a liquid supply pipe of the liquid supply line to recover the liquid from the liquid supply line, wherein the liquid supply line includes:

the liquid supply pipe connected to the nozzle tip, the liquid supply pipe passing through the nozzle arm;

a supply valve installed in the liquid supply pipe; and a heater disposed in the liquid supply pipe, between the nozzle tip and the supply valve, the heater configured to heat the liquid in an ultra-high temperature state, wherein the ultra-high temperature is a temperature over 200° C.; and the liquid supply pipe including a branch point between the supply valve and the nozzle tip, the branch point being a junction at which a discharge pipe portion of the liquid supply pipe connected to the nozzle tip and the liquid recovery pipe of the liquid recovery line branch from, wherein at least a portion of the discharge pipe portion extending from the branch point toward the nozzle tip ascends and then descends, and wherein the liquid recovery pipe is configured to be openable and closable such that, with the supply valve open, closing the liquid recovery pipe causes a height level of the liquid at the branch point to increase to discharge the liquid through the nozzle tip, and opening liquid recovery pipe causes the height level of the liquid at the branch point not to increase such that discharge through the nozzle tip is not performed.

2. The substrate processing apparatus of claim 1, wherein the nozzle unit comprises:

the nozzle arm extending onto an upper side of the substrate; and the nozzle tip connected to the nozzle arm, wherein the liquid supply pipe includes:

a first supply pipe connecting a liquid supply unit and the nozzle arm; and a second supply pipe passing through the nozzle arm from the first supply pipe and connected to the nozzle tip, wherein the heater is installed in the second supply pipe.

3. The substrate processing apparatus of claim 2, wherein the liquid recovery line includes:

a recovery valve installed on the liquid recovery pipe; and a cooler disposed between a branch point in the liquid recovery pipe, branched off the liquid supply pipe, and the recovery valve.

4. The substrate processing apparatus of claim 3, wherein the liquid recovery pipe comprises:

a first recovery pipe branching from the second supply pipe and passing through the nozzle arm; and a second recovery pipe extending from the first recovery pipe into an area outside of the nozzle arm, wherein the cooler is installed in the first recovery pipe.

5. The substrate processing apparatus of claim 4, wherein the supply valve is disposed in the first supply pipe, and the recovery valve is disposed in the second recovery pipe.

6. The substrate processing apparatus of claim 4, wherein the first supply pipe and the second recovery pipe, disposed in the area outside of the nozzle arm, are formed of a material containing resin, and the second supply pipe and the first recovery pipe, passing through the nozzle arm in which the heater is disposed, are formed of a material containing quartz.

7. The substrate processing apparatus of claim 3, wherein the second supply pipe comprises a supply pipe portion in which the heater is installed and the discharge pipe portion is connected to the nozzle tip, based on the branch point at which the liquid recovery pipe is branched, wherein the discharge pipe portion ascends from the branch point to a highest point positioned higher than a height level of the nozzle tip and then descends toward the nozzle tip, the lowest point of the discharge pipe portion being positioned lower than a height level of the branch point.

8. The substrate processing apparatus of claim 3, wherein a first temperature sensor measuring a temperature of the liquid heated by the heater is installed in the liquid supply pipe, and a second temperature sensor measuring a temperature of the liquid cooled by the cooler is installed in the liquid recovery pipe.

9. The substrate processing apparatus of claim 1, wherein the supply valve is a valve closest to the nozzle tip, among a plurality of valves installed in the liquid supply pipe.

10. A substrate processing apparatus comprising:

a processing chamber including a processing region and a maintenance region, partitioned by a horizontal partition wall;

a processing vessel installed in the processing chamber and having a processing space processing a substrate;

a support unit supporting the substrate in the processing space;

a nozzle unit including a nozzle tip discharging liquid to the substrate, wherein the liquid is configured for etching a film formed on the substrate;

a liquid supply line supplying the liquid to the nozzle unit; and a liquid recovery line including a liquid recovery pipe branched from a liquid supply pipe of the liquid supply line to recover the liquid from the liquid supply line, wherein the nozzle unit includes a nozzle arm disposed in the processing region and extending onto an upper side of the substrate and a nozzle tip connected to the nozzle arm, wherein the liquid supply line includes the liquid supply pipe connected to the nozzle tip, the liquid supply pipe passing through the nozzle arm; a supply valve installed in the liquid supply pipe; and a heater installed in the liquid supply pipe, and between the nozzle tip and the supply valve, the liquid supply pipe passing through the nozzle arm, the heater configured to heat the liquid in an ultra-high temperature state, wherein the ultra-high temperature is a temperature over 200° C.; and the liquid supply pipe including a branch point between the supply valve and the nozzle tip, the branch point being a junction at which a discharge pipe portion of the liquid supply pipe connected to the nozzle tip and the liquid recovery pipe of the liquid recovery line branch from, wherein at least a portion of the discharge pipe portion extending from the branch point toward the nozzle tip ascends and then descends, and wherein the liquid recovery pipe is configured to be openable and closable such that, with the supply valve open, closing the liquid recovery pipe causes a height level of the liquid at the branch point to increase to discharge the liquid through the nozzle tip, and opening the liquid recovery pipe causes the height level of the liquid at the branch point not to increase such that discharge through the nozzle tip is not performed.

11. The substrate processing apparatus of claim 10, wherein the liquid supply pipe comprises:

a first supply pipe connecting a liquid supply unit and the nozzle arm and passing through the maintenance region of the processing chamber; and a second supply pipe passing through the nozzle arm from the first supply pipe and connected to the nozzle tip, wherein the heater is installed in the second supply pipe.

12. The substrate processing apparatus of claim 11, wherein the liquid recovery line includes:

a recovery valve installed on the liquid recovery pipe; and a cooler disposed between a branch point in the liquid recovery pipe, branched off the liquid supply pipe, and the recovery valve, wherein the second supply pipe includes a supply pipe portion in which the heater is installed and the discharge pipe portion connected to the nozzle tip, based on the branch point at which the liquid recovery pipe is branched, wherein the discharge pipe portion ascends from the branch point to a highest point positioned higher than a height level of the nozzle tip and then descends toward the nozzle tip, the lowest point of the discharge pipe portion being positioned lower than a height level of the branch point.

13. A substrate processing method comprising:

discharging liquid to a substrate through a nozzle tip of a nozzle unit, wherein the liquid is configured for etching a film formed on the substrate, wherein the discharging includes:

supplying the liquid through a supply valve of a liquid supply line;

heating the liquid passing through the supply valve with a heater, the heater disposed between the nozzle tip and the supply valve, the liquid supply line passing through a nozzle arm, the heater configured to heat the liquid in an ultra-high temperature state, wherein the ultra-high temperature is a temperature over 200° C.;

wherein a liquid recovery pipe of a liquid recovery line branches from a liquid supply pipe of the liquid supply line to recover the liquid from the liquid supply line, wherein the liquid supply pipe including a liquid supply pipe including a branch point between the supply valve and the nozzle tip, the branch point being a junction at which a discharge pipe portion of the liquid supply pipe connected to the nozzle tip and the liquid recovery pipe of the liquid recovery line branch from, wherein at least a portion of the discharge pipe portion extending from the branch point toward the nozzle tip ascends and then descends, and wherein, with the supply valve open, closing the liquid recovery pipe causes a height level of the liquid at the branch point to increase to discharge the liquid through the nozzle tip, and opening the liquid recovery pipe causes the height level of the liquid at the branch point not to increase such that discharge of the liquid through the nozzle tip is not performed; and discharging the heated liquid from the nozzle tip.

14. The method of claim 13, wherein the liquid supply line passes through a nozzle arm of the nozzle unit, and in the heating, the liquid is heated in the nozzle arm by the heater, before the liquid is discharged from the nozzle tip.

15. The method of claim 14, wherein, before the heating, the liquid is preheated by a preheater, before the liquid reaches the nozzle unit.

16. The method of claim 14, wherein the liquid recovery line comprises a recovery valve, and the method further comprises a first circulation performed as a preparation before the discharging, wherein in the first circulation, the supply valve and the recovery valve are opened to recover the liquid supplied through the liquid supply line to the liquid recovery line, and circulate the same, and the heater and a cooler of the liquid recovery line are operated in the first circulation.

17. The method of claim 16, wherein, when the liquid ascends to a target temperature for discharge by the heater, the first circulation is converted to the discharging, and in the discharging, the recovery valve is closed to raise a height level of the liquid in the liquid supply line than a height level of a branch point at which the liquid recovery line is downwardly branched.

18. The method of claim 16, further comprising a second circulation of opening the recovery valve and stopping an operation of the heater after the discharging.

19. The method of claim 18, further comprising closing the supply valve and the recovery valve and stopping an operation of the cooler, wherein, when the liquid falls below a set temperature by the cooler, the second circulation is converted to the closing.

* * * * *